United States Patent
Seo et al.

(10) Patent No.: US 7,323,906 B2
(45) Date of Patent: Jan. 29, 2008

(54) SIMULTANEOUS BI-DIRECTIONAL BUFFER INCLUDING SELF-TEST CIRCUIT HAVING FUNCTION OF GENERATING INPUT SIGNAL AND SELF TESTING METHOD OF THE SIMULTANEOUS BI-DIRECTIONAL BUFFER

(75) Inventors: Hee-young Seo, Suwon (KR); Jung-hwan Choi, Suwon (KR)

(73) Assignee: Samsung Electronics Co., Ltd. (KR)

( * ) Notice: Subject to any disclaimer, the term of this patent is extended or adjusted under 35 U.S.C. 154(b) by 839 days.

(21) Appl. No.: 10/719,085

(22) Filed: Nov. 21, 2003

(65) Prior Publication Data

US 2004/0109464 A1    Jun. 10, 2004

(30) Foreign Application Priority Data

Dec. 5, 2002    (KR) ...................... 10-2002-0077033

(51) Int. Cl.
  *H03K 19/0175*    (2006.01)
(52) U.S. Cl. ........................... 326/82; 326/16; 326/83; 326/86
(58) Field of Classification Search ............. 326/16, 326/26–27, 30, 82–83, 86, 90, 112
See application file for complete search history.

(56) References Cited

U.S. PATENT DOCUMENTS 5,621,739 A * 4/1997 Sine et al. .................. 714/724
6,275,066 B1   8/2001 Park et al. ..................... 326/86
6,639,426 B2 * 10/2003 Haycock et al. ............... 326/82

* cited by examiner

*Primary Examiner*—Anh Q. Tran
(74) *Attorney, Agent, or Firm*—Mills & Onello LLP

(57) ABSTRACT

Provided are a simultaneous bi-directional (SBD) buffer including a self-test circuit having a function of generating an input signal. By using the self-test circuit, self-testing can be accurately performed by generating the input signal in a self-test mode, and a self-test method used by the SBD buffer. The SBD buffer includes an output driver, an input receiver, a first multiplexer, and an input signal generating circuit. The output driver receives an output data signal and outputs the received output data signal to an input/output node. The input receiver receives a signal generated by combining an input data signal inputted to the input/output node with the output data signal, compares the voltage level of the signal with a reference voltage, and outputs the comparison result. The first multiplexer outputs the reference voltage in response to a reference voltage selection signal. The input signal generating circuit generates an input signal used for testing in a test mode and outputs the input signal used for testing as the input data signal. Thus, it is possible to accurately test the performance of the SBD buffer when the SBD buffer performs a self-test.

14 Claims, 5 Drawing Sheets

SIMULTANEOUS BI-DIRECTIONAL BUFFER INCLUDING SELF-TEST CIRCUIT HAVING FUNCTION OF GENERATING INPUT SIGNAL AND SELF TESTING METHOD OF THE SIMULTANEOUS BI-DIRECTIONAL BUFFER

BACKGROUND OF THE INVENTION

This application claims priority from Korean Patent Application No. 2002-77033, filed on 5 Dec. 2002, in the Korean Intellectual Property Office, the contents of which are incorporated herein in their entirety by reference.

1. Field of the Invention

The present invention relates to a simultaneous bi-directional (SBD) buffer, and more particularly, to a simultaneous bi-directional (SBD) buffer including a self-test circuit having a function of generating an input signal and a self-testing method of the SBD buffer.

2. Description of the Related Art

As semiconductor devices operate at higher and higher speeds, perform more functions, and become more highly integrated, an operating frequency, a channel bandwidth, and the number of input/output nodes thereof increase. Thus, it becomes more important to effectively control the operating frequency, to increase the efficiency of a channel, and to effectively use the input/output nodes.

Figure 1:
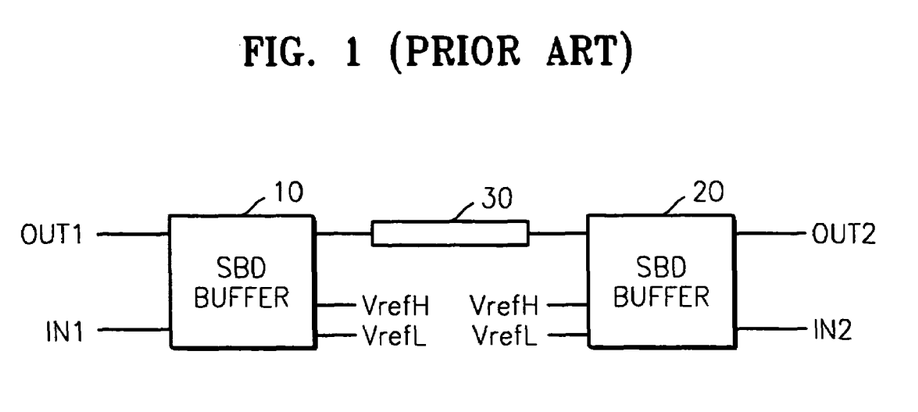
FIG. 1 is a block diagram showing connections of general simultaneous bi-directional (SBD) buffers.

In order to keep up with such demands, simultaneous bi-directional (SBD) transmission is suggested. U.S. Pat. No. 6,275,066 has disclosed a conventional SBD buffer. In SBD transmission, signals are simultaneously transmitted and received over one channel. Thus, the channel width of the semiconductor devices is doubled without a change in the operating frequency, and the efficiency of the input/output nodes is also doubled. A simultaneous bi-directional (SBD) buffer is used for SBD transmission in applications such as dynamic random access memory (DRAM), for computer graphics applications, where SBD buffers are connected with one another by using point-to-point links or a cache memory that does not need extension thereof. FIG. 1 shows SBD buffers connected with one another by using point-to-point links.

FIG. 1 is a block diagram showing connections of general SBD buffers.

In FIG. 1, input/output nodes of SBD buffers 10 and 20 are connected with one another by a channel 30, and reference voltages VrefH and VrefL are inputted to each of the SBD buffers 10 and 20.

The SBD buffers 10 and 20 are included in separate semiconductor devices, and the reference voltages VrefH and VrefL are generated by a separate reference voltage generating circuit (not shown).

Data input and output between the SBD buffers 10 and 20 will be described with reference to FIG. 2.

Figure 2:
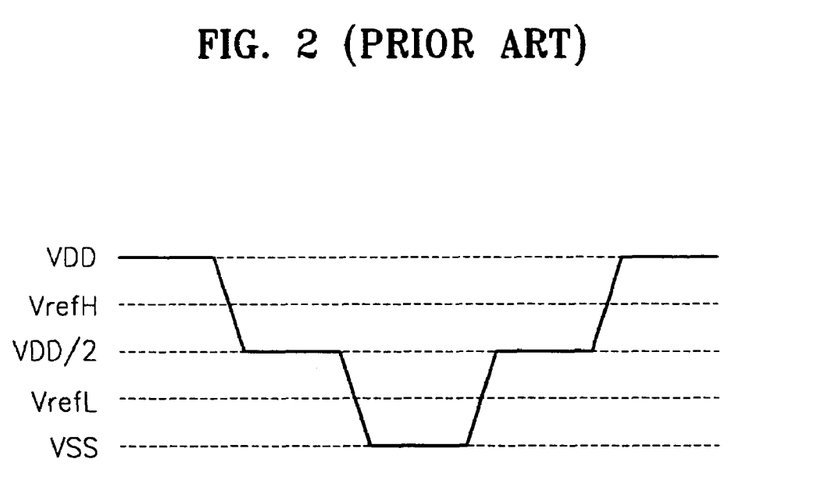
FIG. 2 shows changes in voltage levels of input signals to SBD buffers of FIG. 1 depending on the values of output signals of the SBD buffers.

FIG. 2 shows changes in voltage levels of input signals of the SBD buffers 10 and 20 depending on the values of output signals of the SBD buffers 10 and 20 of FIG. 1.

A relationship between the input signals of FIG. 2 and the output signals of the SBD buffers 10 and 20 of FIG. 1 is illustrated in Table 1.

TABLE 1

| OUT1 | OUT2 | IN1 | IN2 | Voltage |
|---|---|---|---|---|
| 1 | 1 | 1 | 1 | VDD |
| 1 | 0 | 0 | 1 | VDD/2 |

TABLE 1-continued

| OUT1 | OUT2 | IN1 | IN2 | Voltage |
|---|---|---|---|---|
| 0 | 0 | 0 | 0 | VSS |
| 0 | 1 | 1 | 0 | VDD/2 |
| 1 | 1 | 1 | 1 | VDD |

As shown in Table 1, when output signals OUT1 and OUT2 of the SBD buffers 10 and 20 are 1, input signals IN1 and IN2 are 1, and the voltage levels of the input signals IN1 and IN2 are VDD.

When the output signal OUT1 is 1 and the output signal OUT2 is 0, the input signal IN1 is 0 and the input signal IN2 is 1. Here, the voltage levels of the input signals IN1 and IN2 are VDD/2.

When the output signals OUT1 and OUT2 are both 0, the input signals IN1 and IN2 are both 0, and the voltage levels of IN1 and IN2 are VSS.

As described above, since the SBD buffers 10 and 20 transmit signals through a channel 30 using SBD transmission, the voltage levels of the input signals IN1 and IN2 of the SBD buffers 10 and 20 are selected from among three voltage levels VDD, VDD/2, and VSS depending on the values of the output signals OUT1 and OUT2.

As shown in FIG. 2, the SBD buffers 10 and 20 use the reference voltages VrefH and VrefL to read the input signals. Here, a voltage level of the reference voltage VrefH is 3VDD/4, and a voltage level of the reference voltage VrefL is VDD/4.

Operation of the SBD buffers 10 and 20 will be described with reference to FIG. 3.

Figure 3:
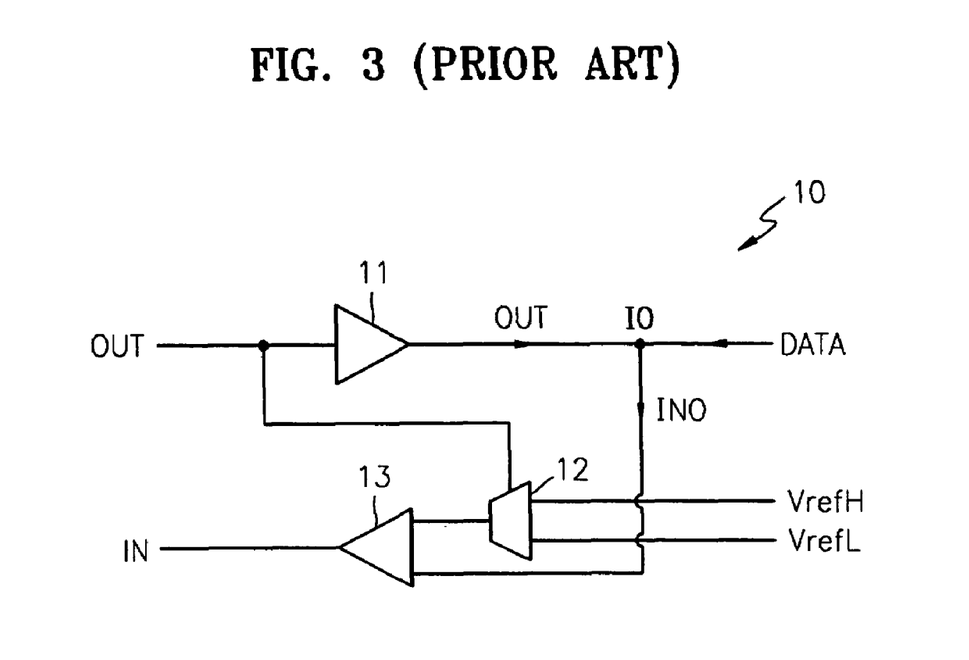
FIG. 3 is a detailed circuit diagram of the SBD buffer of FIG. 1.

FIG. 3 is a circuit diagram of the SBD buffers 10 and 20 of FIG. 1.

As shown in FIG. 3, the SBD buffer 10 includes an output driver 11, a multiplexer 12, and an input receiver 13.

The output driver 11 receives an output data signal OUT and outputs the received output data signal OUT to an input/output node IO. The multiplexer 12 outputs one of the reference voltages VrefH and VrefL in response to the output data signal OUT.

When the output data signal OUT is high, the multiplexer 12 outputs the reference voltage VrefH. When the output data signal OUT is low, the multiplexer 12 outputs the reference voltage VrefL.

The input receiver 13 compares the reference voltage VrefH or VrefL with an input signal INO outputted from the input/output node IO and outputs a comparison result.

Operation of the SBD buffer 10 will be described with reference to FIG. 4.

Figure 4:
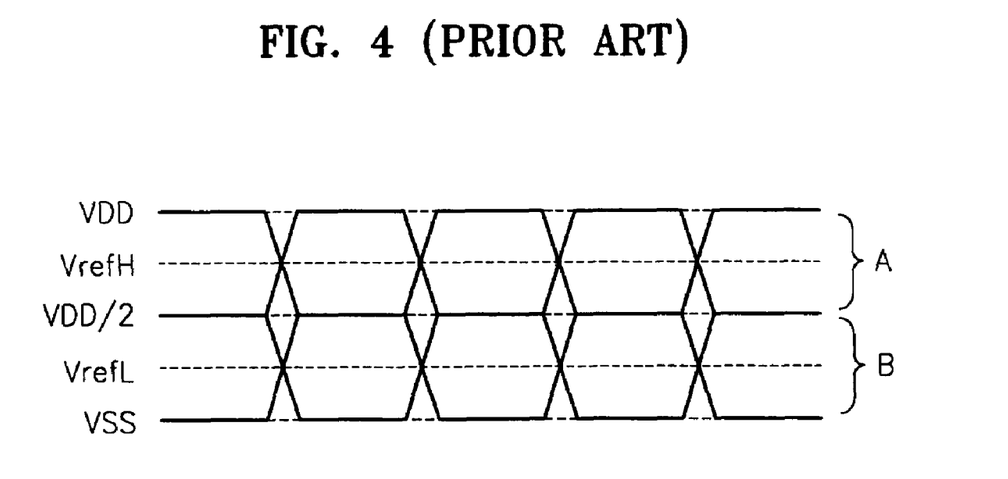
FIG. 4 shows a waveform of input signals of the SBD buffer of FIG. 3.

FIG. 4 shows a waveform of input data signals inputted to the input/output node IO of the SBD buffer 10 of FIG. 3.

As shown in FIG. 4, when the output data signal OUT of the SBD buffer 10 is high, that is, the voltage level of the output data signal OUT is VDD, the multiplexer 12 outputs the reference voltage VrefH.

Since the output data signal OUT is high, i.e., the voltage level of the output data signal OUT is VDD, if an input data signal DATA inputted to the input/output node IO is high, the input signal INO inputted to the input receiver 13 is high. When the output data signal OUT is high, i.e., the voltage level of the output signal OUT is VDD, if the input data signal data is low, i.e., VSS, the input data signal is mid level, i.e., VDD/2.

The input receiver 13 compares the input signal INO which is a high level or a mid level, i.e., VDD/2, with the reference voltage VrefH and outputs the comparison result.

Therefore, as indicated by "A" in FIG. 4, the range of the voltage level of the input signal INO is from VDD to VDD/2.

In the meantime, when the output data signal OUT is low, i.e., VSS, the multiplexer 12 outputs the reference voltage VrefL.

When the output data signal OUT is low, if the input data signal DATA inputted to the input/output node IO is high, the input signal INO inputted to the input receiver 13 is a mid level, i.e., VDD/2. When the output data signal OUT is low, if the input data signal DATA is low, i.e., VSS, the input signal INO inputted to the input receiver 13 is low, i.e., VSS.

The input receiver 13 compares the input data signal INO, which is at the mid level, i.e., VDD/2, or at the low level, i.e., VSS, with the reference voltage VrefL and outputs the comparison result.

Therefore, as indicated by "B" in FIG. 4, a range of the voltage level of the input signal INO is from VDD/2 to VSS. Thus, the SBD buffers 10 and 20 can simultaneously output and input data through one channel.

As described above, the SBD buffer makes it possible to simplify a package of a semiconductor device by reducing the channel bandwidth and the number of pins of a semiconductor chip. However, test equipment manufactured by using the SBD buffer_is needed to test the semiconductor device. In addition, the test equipment has to be manufactured by using a circuit having the same characteristics as an output buffer, i.e., the same output impedance and output current, and the same characteristics as an input buffer, i.e., the same input load and a reference voltage.

Figure 5:
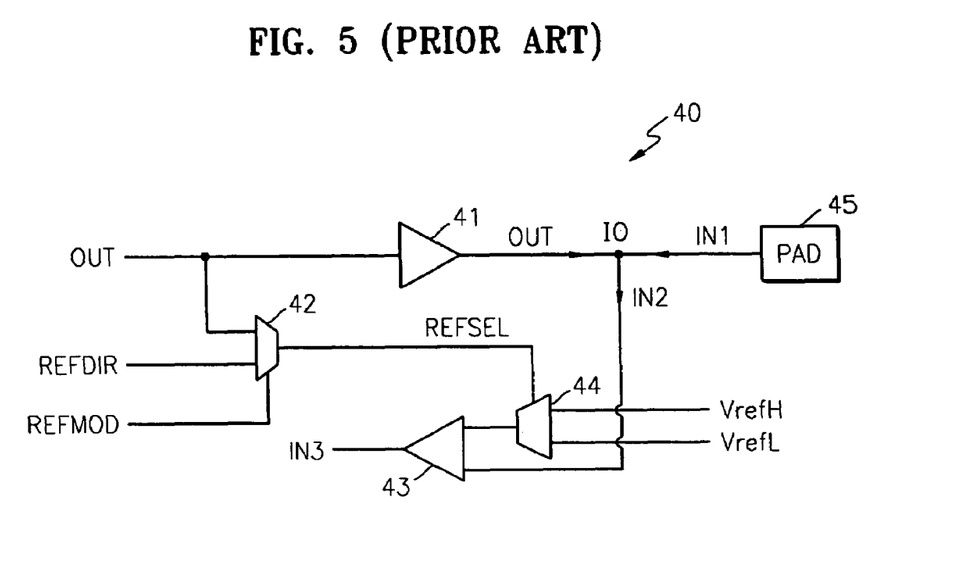
FIG. 5 is a circuit diagram of an SBD buffer having a conventional self-test circuit.

A self-test method suggested to solve the problems is shown in FIG. 5.

FIG. 5 is a circuit diagram of an SBD buffer having a conventional self-test circuit.

As shown in FIG. 5, an SBD buffer 40 includes an output driver 41, a first multiplexer 42, an input receiver 43, and a second multiplexer 44.

The output driver 41 receives an output data signal OUT and outputs the received output data signal OUT to an input/output node IO. In response to a control signal REFMOD, the first multiplexer 42 outputs the output data signal OUT or a control signal REFDIR as a reference voltage selection signal REFSEL.

Here, the control signal REFMOD selects one of a test mode and a normal operation mode. The control signal REFMOD is activated when the SBD buffer 40 operates in the test mode and is deactivated when the SBD buffer 40 operates in the normal operation mode. A voltage level of the control signal REFDIR changes into high or low and is the same as the voltage level of the output data signal OUT.

The second multiplexer 44 outputs one of the inputted reference voltages VrefH and VrefL in response to the reference voltage selection signal REFSEL. The second multiplexer 44 outputs the reference voltage VrefH when the reference voltage selection signal REFSEL is high and outputs the reference voltage VrefL when the reference voltage selection signal REFSEL is low.

The input receiver 43 compares an input signal IN2 output from the input/output node IO with the reference voltage VrefH or VrefL and outputs the comparison result.

Here, the input signal IN2 is generated by combining the output data signal OUT with an input signal IN1 inputted from the outside through a pad 45.

Self-testing operations of the SBD buffer circuit are in accordance with the following.

If the control signal REFMOD is activated to initiate the test mode, the first multiplexer 42 outputs the control signal REFDIR as the reference voltage selection signal REFSEL. Here, as the control signal REFDIR changes into high or low and is the same as the voltage level of the output data signal OUT, the voltage level of the reference voltage selection signal REFSEL also changes. As a result, the second multiplexer 44 outputs different reference voltages, based on the voltage level of the reference voltage selection signal REFSEL, in the test mode.

More specifically, the reference voltage selection signal REFSEL controls the second multiplexer 44 such that the second multiplexer 44 outputs the reference voltage VrefH when the output data signal OUT is high and outputs the reference voltage VrefL when the output data signal OUT is low.

The input receiver 43 compares the input data signal IN2 output from the input/output node IO with the reference voltage VrefH or VrefL and outputs the comparison result. Since the input signal IN1 is not inputted to the input/output node IO in the test mode, the input signal IN2 is equal to the output data signal OUT.

The input receiver 43 outputs an input signal IN3 having the same voltage level as that of the output data signal OUT. That is, if the output data signal OUT is high, i.e., VDD, the input signal IN3 is high, i.e., VDD, and if the output data signal OUT is low, i.e., VSS, the input signal IN3 is low, i.e., VSS.

Therefore, since the conventional SBD buffer according to prior art performs self-test by using only its output data signal without using the input data signal from outside, it is impossible to accurately test its performance in a range of whole voltage levels.

Figure 6:
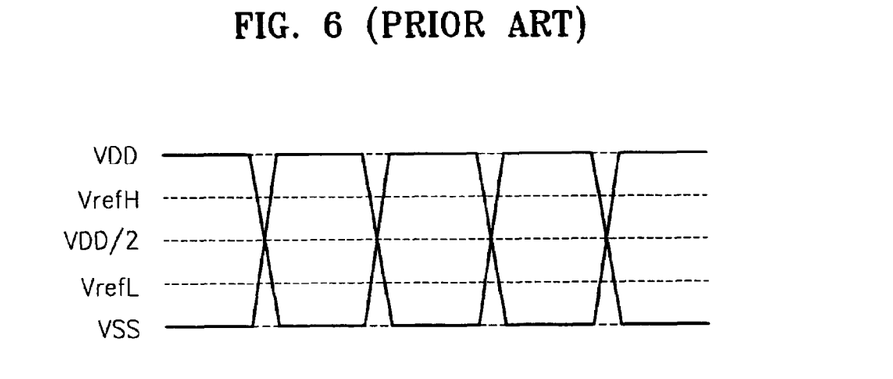
FIG. 6 is a waveform of input signals when the SBD buffer of FIG. 5 performs self-test.

FIG. 6 is a waveform of input signals when the SBD buffer of FIG. 5 performs self-test by using only its output data signal without using the input data signal from outside.

As shown in FIG. 6, since the input data signal from outside is not used, the input signal is high if the output data signal OUT is high, and the input signal is low if the output data signal OUT is low.

Since the SBD buffer performs self-test without using the input signal having the mid level, i.e., VDD/2, it is not possible to accurately test its performance. In addition, the voltage levels of the reference voltages VrefH and VrefL change into 3VDD/4 or VDD/4 according to the output data signals, but the voltage level of the input data signal changes into high, i.e., VDD, or low, i.e., DSS, according to the output data signal OUT. As a result, the noise margin of the input data signal in a self-testing operation of the SBD buffer is increased by 3 times that in an actual operation of the SBD buffer.

SUMMARY OF THE INVENTION

The present invention provides a simultaneous bi-directional (SBD) buffer including a self-test circuit having a function of generating an input signal. By using the self-test circuit, self-testing can be performed by generating the input signal in a self-test mode. The present invention also provides a self-test method used by the SBD buffer.

According to one aspect of the present invention, there is provided a simultaneous bi-directional (SBD) buffer which includes a self-test circuit having a function of generating an input signal. The SBD buffer comprises an output driver, an input receiver, a first multiplexer, and an input signal generating circuit. The output driver receives an output data signal and outputs the received output data signal to an input/output node. The input receiver receives a signal generated after combining an input data signal inputted to the input/output node with the output data signal, compares the signal with a reference voltage, and outputs a comparison result. The first multiplexer outputs the reference voltage in response to a reference voltage selection signal. The input signal generating circuit generates an input signal used for testing in a test mode and outputs the input signal used for testing as the input data signal.

In one embodiment, the reference voltage selection signal is either the output data signal or a first control signal. The SBD buffer can further include a second multiplexer which outputs either the output data signal or the first control signal as the reference voltage selection signal in response to a test mode activation signal activated in the test mode.

The input signal generating circuit can include (i) a multiplexer which outputs a signal having a predetermined voltage level in response to a second control signal, (ii) an output driver which receives an output signal of the multiplexer and outputs the input signal used for testing to the input/output node, and (iii) a switching means which is connected between the output driver and the input/output node, is switched in response to an enable signal activated in the test mode, and outputs the input signal used for testing to the input/output node.

Alternatively, the input signal generating circuit can include (i) a delay circuit which delays the output data signal for a predetermined amount of time and outputs the input signal used for testing to the input/output node, and (ii) a switching means which is connected between the delay circuit and the input/output node, is switched in response to the enable signal activated in the test mode, and outputs the input signal used for testing to the input/output node.

In one embodiment, the input signal used for testing has either an internal voltage level or a ground voltage level.

In one embodiment, a voltage level of an input signal inputted to the input receiver changes according to voltage levels of the output data signal and the input signal used for testing in the test mode. The input signal inputted to the input receiver can have one of the internal voltage level, half the internal voltage level, and the ground voltage level in the test mode.

In one embodiment, the reference voltage can be either ¾ times the internal voltage or ¼ times the internal voltage.

According to another aspect of the present invention, there is provided a self-test method of a simultaneous bi-directional (SBD) buffer which includes a self-test circuit having a function of generating an input signal. The method comprises outputting an output data signal to an input/output node, selecting a voltage level of a reference voltage in response to a reference voltage selection signal, generating an input signal used for testing in a test mode and outputting the generated input signal used for testing to the input/output node, and comparing a signal generated by combining the output data signal with the input signal used for testing with the reference voltage and outputting the comparison result.

In one embodiment, the input signal used for testing has either the internal voltage level or the ground voltage level. The signal generated by combining the output data signal with the input signal used for testing can have one of the internal voltage level, half the internal voltage level, and the ground voltage level.

In one embodiment, the reference voltage is either ¾ times the internal voltage or ¼ times the internal voltage.

BRIEF DESCRIPTION OF THE DRAWINGS

The foregoing and other objects, features and advantages of the invention will be apparent from the more particular description of a preferred embodiment of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE INVENTION

The present invention will now be described more fully with reference to the accompanying drawings, in which preferred embodiments of the invention are shown.

Figure 7:
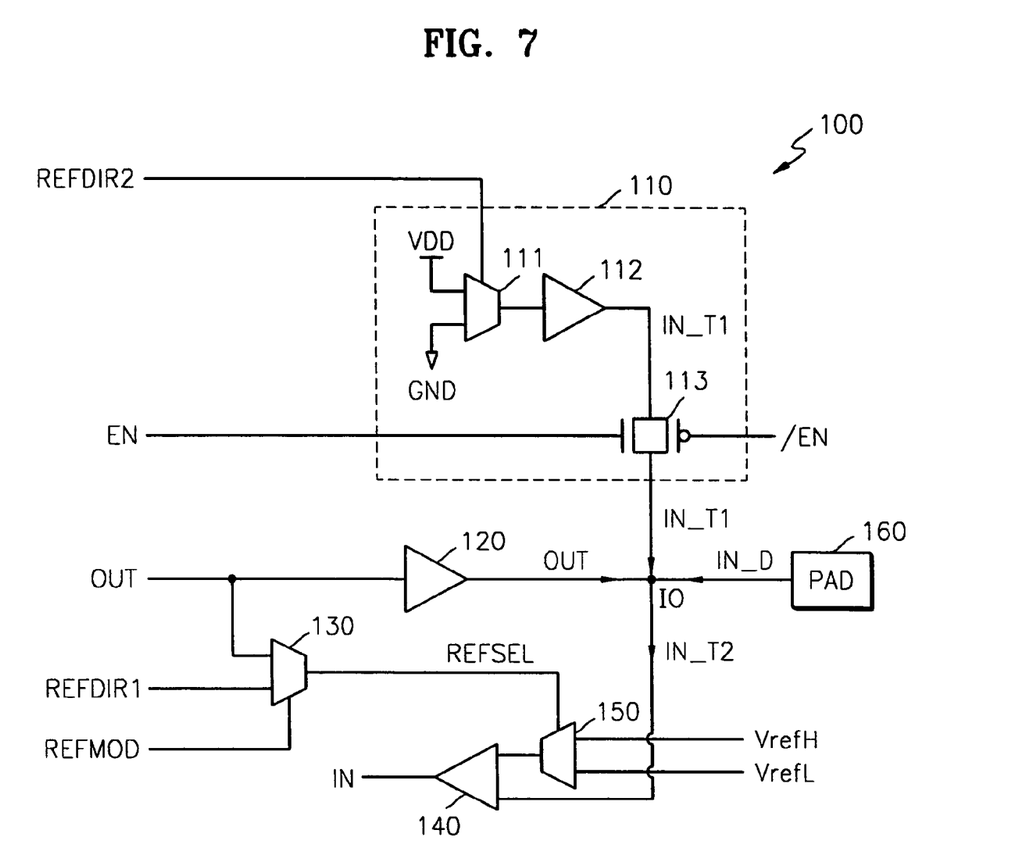
FIG. 7 is a circuit diagram of an SBD buffer including a self-test circuit having a function of generating input signals according to a first embodiment of the present invention.

FIG. 7 is a circuit diagram of a simultaneous bi-directional (SBD) buffer 100 including a self-test circuit having a function of generating input signals according to a first embodiment of the present invention. The SBD buffer 100 includes an input signal generating circuit 110, a first output driver 120, a first multiplexer 130, an input receiver 140, a second multiplexer 150, and a pad 160.

The input signal generating circuit 110 outputs an input signal IN_T1 used for testing to an input/output node IO in response to a control signal REFDIR2 and an enable signal EN. The input signal generating circuit 110 includes a third multiplexer 111, a second output driver 112, and a transmission gate 113.

The third multiplexer 111 outputs either a signal having an internal voltage level VDD or a signal having a ground voltage level in response to the control signal REFDIR2. The second output driver 112 receives an output signal of the third multiplexer 111 and outputs the received output signal to the transmission gate 113, which outputs the input signal IN_T1 used for testing.

The transmission gate 113 is turned on when enable signals EN and /EN are activated and outputs the input signal IN_T1 used for testing to the input/output node IO.

The control signal REFDIR2 and the enable signal EN are enabled in a test mode of the SBD buffer 100 and inputted from outside by an additional control circuit (not shown).

The input signal generating circuit 110 includes the third multiplexer 111, the second output driver 112, and the transmission gate 113 in this embodiment. However, the input signal generating circuit 110 may include other components if it has the same performance of an output buffer as that of the SBD buffer 100.

The first output driver 120 receives an output data signal OUT and outputs the received output data signal OUT to the input/output node IO. In the test mode, the first multiplexer 130 outputs a control signal REFDIR1 as a reference voltage selection signal REFSEL in response to a test mode activation signal REFMOD. In addition, in a normal operation mode, the first multiplexer 130 outputs the output data signal OUT as the reference voltage selection signal REFSEL.

Here, the test mode activation signal REFMOD is activated in the test mode and is deactivated if the test mode is completed. The voltage level of the control signal REFDIR1 changes into high or low according to the output data signal OUT. As the voltage level of the control signal REFDIR1 changes, the voltage level of the reference voltage selection signal REFSEL also changes.

The reference voltage selection signal REFSEL controls the second multiplexer 150 such that the second multiplexer 150 outputs a reference voltage VrefH when the output data signal OUT is high and outputs a reference voltage VrefL when the output data signal OUT is low.

Here, the reference voltage VrefH has a voltage level of 3VDD/4, and the reference voltage VrefL has a voltage level of VDD/4.

The input receiver 140 compares an input data signal IN_T2 output from the input/output node IO with the reference voltage VrefH or VrefL and outputs an input signal IN.

Here, the input signal IN_T2 is generated by combining the output data signal OUT with the input signal IN_T1 used for testing and an input data signal IN_D inputted through the pad 160.

Hereinafter, self-testing operations of the SBD buffer 100 will be described.

The test mode activation signal REFMOD and the enable signal EN are activated to test the SBD buffer 100.

The first multiplexer 130 outputs the control signal REFDIR1 as the reference voltage selection signal REFSEL in response to the test mode activation signal REFMOD.

Here, the control signal REFDIR1 changes depending on the value of the output data signal OUT. That is, the control signal REFDIR1 changes into high or low and is the same as the voltage level of the output data signal OUT.

In addition, the second multiplexer 150 outputs one of the reference voltages VrefH and VrefL in response to the reference voltage selection signal REFSEL.

More specifically, when the output data signal OUT is high, the control signal REFDIR1 becomes high. Thus, the reference voltage selection signal REFSEL becomes high.

When the reference voltage selection signal REFSEL is high, the second multiplexer 150 outputs the reference voltage VrefH.

When the output data signal OUT is low, the control signal REFDIR1 becomes low, thus the reference voltage selection signal REFSEL becomes low.

When the reference voltage selection signal REFSEL is low, the second multiplexer 150 outputs the reference voltage VrefL.

Therefore, when the output data signal OUT is high, the reference voltage VrefH is outputted, and when the output data signal OUT is low, the reference voltage VrefL is outputted.

Here, when the reference voltage selection signal REFSEL is high, the second multiplexer 150 outputs the reference voltage VrefH. However, it is possible to set the second multiplexer 150 such that the second multiplexer 150 outputs the reference voltage VrefH when the reference voltage selection signal REFSEL is low.

A case where the output data signal OUT is high will now be described.

Since the output data signal OUT is, high, the second multiplexer 150 outputs the reference voltage VrefH.

In addition, the third multiplexer 111 outputs either a signal having an internal voltage level VDD or a signal having a ground voltage level in response to the control signal REFDIR2. A case where the third multiplexer 111 outputs the signal having the internal voltage level VDD will be described.

The second output driver 112 outputs the signal having the internal voltage level VDD as the input signal IN_T1 used for testing. Also, the transmission gate 113 is turned on in response to the enable signals EN and /EN and outputs the input signal IN_T1 used for testing to the input/output node IO.

Since the input data signal IN_D is not inputted from the pad 160 in the test mode, the input signal IN_T2 is outputted after the output data signal OUT and the input signal IN_T1 used for testing are combined at the input/output node IO. Here, the input data signal IN_T2 has the internal voltage level VDD.

The input receiver 140 compares the input signal IN_T2 with the reference voltage VrefH and outputs the input signal IN.

A case where the input signal generating circuit 110 outputs a low voltage level as the input signal IN_T1 used for testing is as follows.

The third multiplexer 111 outputs the signal having the ground voltage level in response to the control signal REFDIR2. The second output driver 112 outputs the signal having the ground voltage level as the input signal IN_T1 used for testing. Since the enable signals EN and /EN are activated, the transmission gate 113 outputs the input signal IN_T1 used for testing to the input/output node IO.

Since the input data signal IN_D is not inputted to the input/output node IO from the pad 160, the input signal IN_T2 is outputted after combining the output data signal OUT with the input signal IN_T1 used for testing at the input/output node IO. Here, the input signal IN_T2 has a voltage level of VDD/2.

The input receiver 140 compares the input signal IN_T2 with the reference voltage VrefH and outputs the input signal IN.

Next, when the output data signal OUT is low, the control signal REFDIR1 becomes low. Thus, the reference voltage selection signal REFSEL becomes low. The second multiplexer 150 outputs the reference voltage VrefL in response to the reference voltage selection signal REFSEL.

When the output data signal OUT is low, the input signal IN_T1 used for testing output from the input signal generating circuit 100 has a high or low voltage level. Thus, the input signal IN_T2 at the input/output node 10 has a voltage level of VDD/2 or VSS.

Figure 8:
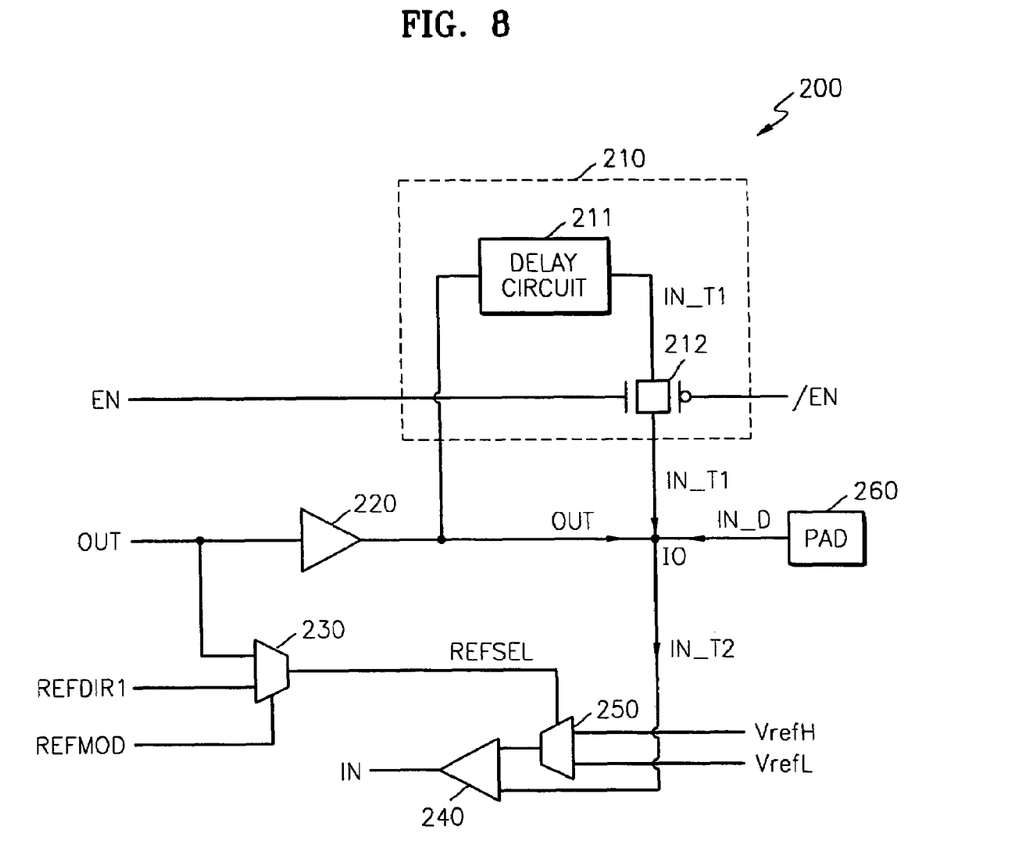
FIG. 8 is a circuit diagram of an SBD buffer including a self-test circuit having a function of generating input signals according to a second embodiment of the present invention.

FIG. 8 is a circuit diagram of an SBD buffer including a self-test circuit having a function of generating input signals according to a second embodiment of the present invention.

As shown in FIG. 8, an SBD buffer 200 according to the second embodiment of the present invention includes an input signal generating circuit 210, an output driver 220, a first multiplexer 230, an input receiver 240, a second multiplexer 250, and a pad 260.

The operation of the output driver 220, the first multiplexer 230, the input receiver 240, and the second multiplexer 250 are the same as that of the first output driver 120, the first multiplexer 130, the input receiver 140, and the second multiplexer 150 of FIG. 7. Therefore, description of their operation will not be repeated.

The input signal generating circuit 210 outputs the input signal IN_T1 used for testing to the input/output node IO in response to the enable signal EN. The input signal generating circuit 210 includes a delay circuit 211 and a transmission gate 212.

The delay circuit 211 delays the output data signal OUT outputted through the first output driver 220 for a predetermined amount of time and outputs the input signal IN_T1 used for testing.

The transmission gate 212 is turned on when the enable signals EN and /EN are activated and outputs the input signal IN_T1 used for testing to the input/output node IO.

The enable signal EN is enabled in the test mode of the SBD buffer 200 and is inputted from outside by an additional control circuit (not shown).

In FIG. 8, the input signal generating circuit 210 includes the delay circuit 211 and the transmission gate 212. However, the input signal generating circuit 210 may include other components if it has the same performance of an output buffer as that of the SBD buffer 220.

Self-testing operations of the SBD buffer 200 are as follows.

The test mode activation signal REFMOD and the enable signal EN are activated to test the SBD buffer 200.

The first multplexer 230 outputs the control signal REFDIR1 as the reference voltage selection signal REFSEL in response to the test mode activation signal REFMOD.

Here, the control signal REFDIR1 changes according to the output data signal OUT. That is, the control signal REFDIR1 changes into high or low and is the same as the voltage level of the output data signal OUT.

In addition, the second multiplexer 250 outputs one of the reference voltages VrefH and VrefL in response to the reference voltage selection signal REFSEL.

More specifically, when the output data signal OUT is high, the control signal REFDIR1 becomes high, thus the reference voltage selection signal REFSEL becomes high.

As the reference voltage selection signal REFSEL is high, the second multiplexer 250 outputs the reference voltage VrefH.

When the output data signal OUT is low, the control signal REFDIR1 becomes low, thus the reference voltage selection signal REFSEL becomes low.

As the reference voltage selection signal REFSEL is low, the second multiplexer 250 outputs the reference voltage VrefL.

Therefore, when the output data signal OUT is high, the reference voltage VrefH is outputted, and when the output data signal OUT is low, the reference voltage VrefL is outputted.

Here, the reference voltage selection signal REFSEL is high, the second multiplexer 250 outputs the reference voltage VrefH. However, it is possible to set the second multiplexer 250 such that the second multiplexer 250 outputs the reference voltage VrefH when the reference voltage selection signal REFSEL is low.

Here, a case where the output data signal OUT is high will be described.

Since the output data signal OUT is high, the first multiplexer 230 outputs the reference voltage VrefH.

In addition, the delay circuit 211 delays the output data signal OUT for a predetermined amount of time and outputs the input signal IN_T1 used for testing. Here, the transmission gate 212 is turned on by the enable signals EN and /EN and outputs the input signal IN_T1 used for testing to the input/output node IO.

Since the input data signal IN_D is not inputted from the 260 in the test mode, the input signal IN_T2 is outputted after the output data signal OUT and the input signal IN_T1 are combined at the input/output node IO. Here, the input signal IN_T2 has the internal voltage level VDD.

The input receiver 240 compares the input signal IN_T2 with the reference voltage VrefH and outputs the input signal IN.

A case where the voltage level of the output data signal OUT changes from high to low after a predetermined amount of time is as follows.

The delay circuit 211 delays the output data OUT signal having a high voltage level and outputs the input signal IN_T1 used for testing.

Thus, the output data signal OUT having a low voltage level and the input signal IN_T1 used for testing having a high voltage level are inputted to the input/output node IO.

Since the input data signal IN_D is not inputted from the pad 260 in the test mode, the input signal IN_T2 is outputted after the output data signal OUT and the input signal IN_T1 are combined at the input/output node IO. Here, the input signal IN_T2 has the internal voltage level VDD/2.

Therefore, when the voltage level of the output data signal OUT changes from high to low, the input signal IN_T2 having the voltage level of VDD or VDD/2 is generated at the input/output node IO.

Self-testing operations when the voltage level of the output data signal OUT changes from low to high will be described.

In a first case where the output signal OUT having the low voltage level and the input signal IN_T1 used for testing having the low voltage level are inputted to the input/output node IO, the input signal IN_T2 having the voltage level of VSS is outputted from the input/output node IO. In a second case where the output data signal OUT having the high voltage level and the input signal IN_T1 used for testing having the low voltage level are inputted to the input/output node IO, the input signal IN_T2 having the voltage level of VDD/2 is outputted from the input/output node IO.

The input receiver 240 compares the input signal IN_T2 with the reference voltage VrefH or VrefL and outputs the input signal IN.

By using the circuit of the SBD buffer of the present invention, it is possible to accurately test the performance of the SBD buffer because the SBD buffer of a semiconductor device, which is tested by the input signal generating circuit, is tested under the same input/output conditions as SBD buffers which are connected with one another by point-to-point links.

As described above, it is possible to accurately test the performance of the SBD buffer by generating an input signal when the SBD performs a self-test.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A simultaneous bi-directional (SBD) buffer which includes a self-test circuit having a function of generating an input signal, the SBD buffer comprising:
   an output driver which receives an output data signal and outputs the received output data signal to an input/output node;
   an input receiver which receives a signal generated after combining an input data signal inputted to the input/output node with the output data signal, compares the signal with a reference voltage, and outputs a comparison result;
   a first multiplexer which outputs the reference voltage in response to a reference voltage selection signal; and
   an input signal generating circuit which generates an input signal used for testing in a test mode and outputs the input signal used for testing as the input data signal.

2. The SBD buffer of claim 1, wherein the reference voltage selection signal is either the output data signal or a first control signal.

3. The SBD buffer of claim 2, wherein the SBD buffer further comprises a second multiplexer which outputs either the output data signal or the first control signal as the reference voltage selection signal in response to a test mode activation signal activated in the test mode.

4. The SBD buffer of claim 2, wherein the input signal generating circuit comprises:
   a multiplexer which outputs a signal having a predetermined voltage level in response to a second control signal;
   an output driver which receives an output signal of the multiplexer and outputs the input signal used for testing to the input/output node; and
   a switching means which is connected between the output driver and the input/output node, is switched in response to an enable signal activated in the test mode, and outputs the input signal used for testing to the input/output node.

5. The SBD buffer of claim 4, wherein the input signal used for testing has either an internal voltage level or a ground voltage level.

6. The SBD buffer of claim 2, wherein the input signal generating circuit comprises:
   a delay circuit which delays the output data signal for a predetermined amount of time and outputs the input signal used for testing to the input/output node; and
   a switching means which is connected between the delay circuit and the input/output node, is switched in response to the enable signal activated in the test mode, and outputs the input signal used for testing to the input/output node.

7. The SBD buffer of claim 6, wherein the input signal used for testing has either an internal voltage level or a ground voltage level.

8. The SBD buffer of claim 1, wherein a voltage level of an input signal inputted to the input receiver changes according to voltage levels of the output data signal and the input signal used for testing in the test mode.

9. The SBD buffer of claim 8, wherein the input signal inputted to the input receiver has one of the internal voltage level, half the internal voltage level, and the ground voltage level in the test mode.

10. The SBD buffer of claim 1, wherein the reference voltage is either ¾ times the internal voltage or ¼ times the internal voltage.

11. A self-test method of a simultaneous bi-directional (SBD) buffer which includes a self-test circuit having a function of generating an input signal, the method comprising:
   (a) outputting an output data signal to an input/output node;
   (b) selecting a voltage level of a reference voltage in response to a reference voltage selection signal;
   (c) generating an input signal used for testing in a test mode and outputting the generated input signal used for testing to the input/output node; and
   (d) comparing a signal generated by combining the output data signal with the input signal used for testing with the reference voltage and outputting the comparison result.

12. The method of claim 11, wherein the input signal used for testing has either the internal voltage level or the ground voltage level.

13. The method of claim 11, wherein the signal generated by combining the output data signal with the input signal used for testing has one of the internal voltage level, half the internal voltage level, and the ground voltage level.

14. The method of claim 11, wherein the reference voltage is either ¾ times the internal voltage or ¼ times the internal voltage.

* * * * *